US012292595B2

(12) United States Patent
Den Haan et al.

(10) Patent No.: US 12,292,595 B2
(45) Date of Patent: May 6, 2025

(54) WAVEGUIDE STRUCTURE FOR A PHOTONIC INTEGRATED CIRCUIT

(71) Applicant: SMART Photonics Holding B.V., Eindhoven (NL)

(72) Inventors: Erik Den Haan, Eindhoven (NL); Rui Manuel Lemos Alvares Dos Santos, Eindhoven (NL)

(73) Assignee: SMART Photonics Holding B.V., Eindhoven (NL)

(*) Notice: Subject to any disclaimer, the term of this patent is extended or adjusted under 35 U.S.C. 154(b) by 272 days.

(21) Appl. No.: 17/750,075

(22) Filed: May 20, 2022

(65) Prior Publication Data

US 2022/0276439 A1   Sep. 1, 2022

Related U.S. Application Data

(63) Continuation of application No. PCT/EP2020/083443, filed on Nov. 26, 2020.

(30) Foreign Application Priority Data

Nov. 26, 2019 (GB) ..................................... 1917186

(51) Int. Cl.
*G02B 6/12* (2006.01)
*H01S 5/026* (2006.01)
(Continued)

(52) U.S. Cl.
CPC .......... *G02B 6/12004* (2013.01); *H01S 5/026* (2013.01); *H01S 5/0421* (2013.01);
(Continued)

(58) Field of Classification Search
CPC ........... G02B 2006/12123; G02B 2006/12126; G02B 2006/12121; G02B 6/136;
(Continued)

(56) References Cited

U.S. PATENT DOCUMENTS

| | | | |
|---|---|---|---|
| 5,007,063 A * | 4/1991 | Kahen | B82Y 20/00 |
| | | | 372/50.1 |
| 5,287,376 A | 2/1994 | Paoli | |

(Continued)

FOREIGN PATENT DOCUMENTS

| | | |
|---|---|---|
| CN | 1547791 A | 11/2004 |
| CN | 104022441 A | 9/2014 |

(Continued)

OTHER PUBLICATIONS

Chinese first Office Action dated Apr. 10, 2024 for Chinese Application No. 2020800818451.

(Continued)

*Primary Examiner* — Michelle R Connelly
*Assistant Examiner* — Kirsten D. Endresen
(74) *Attorney, Agent, or Firm* — EIP US LLP

(57) ABSTRACT

A waveguide structure (100) for a photonic integrated circuit, comprising: a substrate; an active region (102) comprising a diode junction, the active region comprising: a light emission portion (102*a*) to emit light in a first direction and a second direction perpendicular the first direction; and a light absorption portion (102*b*) to absorb light emitted from the light emission portion (102*a*) in the second direction; a first contact corresponding to the light emission portion (102*a*); and a second contact corresponding to the light absorption portion (102*b*).

12 Claims, 6 Drawing Sheets

100

(51) Int. Cl.
  H01S 5/042 (2006.01)
  H01S 5/06 (2006.01)
  G02B 6/136 (2006.01)

(52) U.S. Cl.
  CPC .. H01S 5/0601 (2013.01); *G02B 2006/12097* (2013.01); *G02B 2006/12121* (2013.01); *G02B 2006/12123* (2013.01); *G02B 6/136* (2013.01)

(58) Field of Classification Search
  CPC .......... G02B 2006/12097; H01S 5/026; H01S 5/0421; H01S 5/0601
  See application file for complete search history.

(56) References Cited

U.S. PATENT DOCUMENTS

| | | | |
|---|---|---|---|
| 6,455,338 B1 | 9/2002 | Takagi et al. | |
| 2006/0039666 A1 | 2/2006 | Knights et al. | |
| 2011/0142089 A1* | 6/2011 | Kudo | H01S 5/22 372/46.012 |
| 2016/0291269 A1 | 10/2016 | Klein et al. | |
| 2018/0248630 A1* | 8/2018 | Heimbuch | G02B 6/122 |

FOREIGN PATENT DOCUMENTS

| | | | | |
|---|---|---|---|---|
| CN | 107078145 A | | 8/2017 | |
| DE | 4235920 C1 | * | 11/1993 | ......... G02B 6/12004 |
| DE | 19639909 A1 | * | 4/1998 | ........... G02B 6/1228 |
| EP | 0386797 A2 | | 9/1990 | |
| EP | 0620475 A1 | | 10/1994 | |
| JP | S57139984 A | | 8/1982 | |
| JP | 2000138362 A | | 5/2000 | |
| JP | 2006286810 A | | 10/2006 | |
| JP | 2011082245 A | | 4/2011 | |
| JP | 2014170844 A | | 9/2014 | |
| JP | 2015170750 A | | 9/2015 | |

OTHER PUBLICATIONS

United Kingdom Search Report dated Mar. 29, 2021 for GB Application No. GB1917186.7.
International Search report and Written Opinion dated Mar. 12, 2021 for International PCT Application No. PCT/EP2020/083443.
Japanese Office Action dated Oct. 15, 2024 for Japanese Patent Application No. 2022-528277.

* cited by examiner

WAVEGUIDE STRUCTURE FOR A PHOTONIC INTEGRATED CIRCUIT

CROSS-REFERENCE TO RELATED APPLICATIONS

This application is a continuation of International Application No. PCT/EP2020/083443, filed Nov. 26, 2020 which claims priority to United Kingdom Application No. GB 1917186.7, filed Nov. 26, 2019, under 35 U.S.C. § 119(a). Each of the above referenced patent applications is incorporated by reference in its entirety.

BACKGROUND OF THE INVENTION

Field of the Invention

Photonic Integrated Circuits (PICs) make use of waveguide structures to guide light between components of the PIC.

Unguided light may be a source of noise for other components of a PIC.

It is desirable to reduce the level of noise detectable by components of a PIC.

DETAILED DESCRIPTION

Examples described herein relate to waveguide structures for a Photonic Integrated Circuit (PIC). A PIC may be considered an optical circuit in which two or more photonic devices (e.g. devices that perform functions using light) are optically connected. A PIC may include components that perform functions including, for example: emitting light; detecting light; amplifying light; guiding light; reflecting light; diffracting light; mixing light of different wavelengths; separating light of different wavelengths; polarisation conversion; optical filtering; power splitting; amplitude modulation; and phase modulation. A PIC can be considered an optical analogue of an electronic circuit. PICs typically operate in the visible or near infrared region of the electromagnetic spectrum (e.g. light with wavelengths in the range of approximately 400 nanometres (nm) to approximately 1650 nm); however, PICs can operate in other regions of the electromagnetic spectrum too.

A commercially utilised material platform for PICs is indium phosphide (InP), which allows for integration of optically active and passive functions on the same chip; however, other material platforms such as silicon (Si), Gallium Arsenide (GaAs) or lithium niobite (LiNBO$_3$), may be utilised as a platform for PICs. A PIC may comprise hundreds of components integrated in a single chip.

Figure 1A:
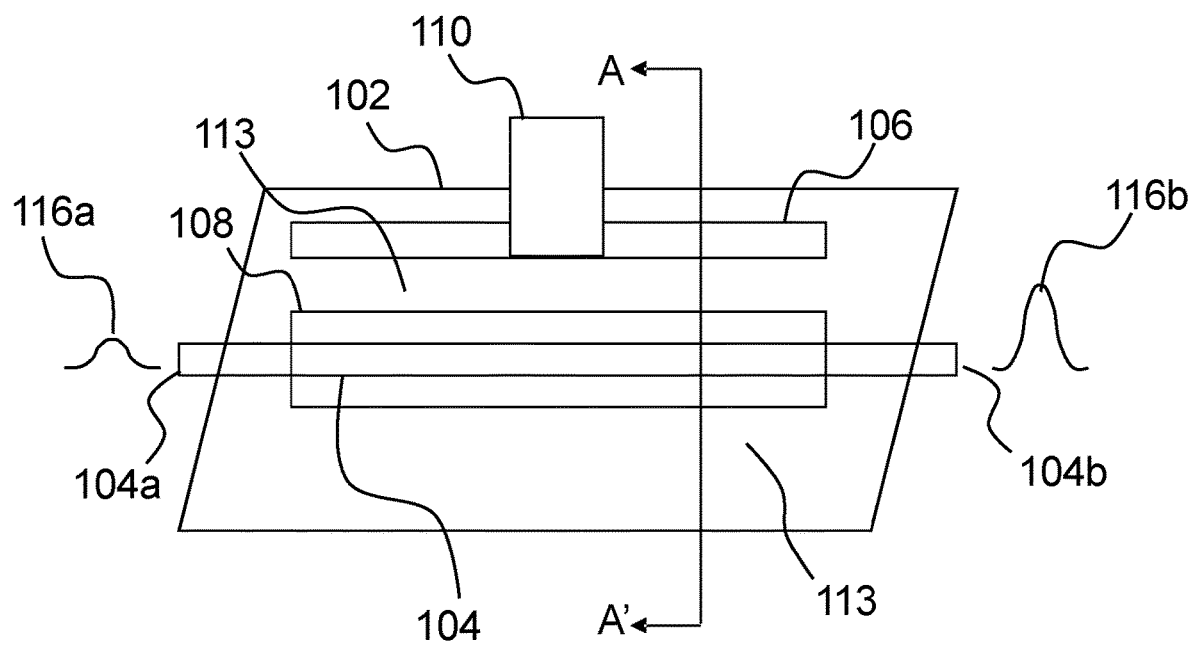
FIG. 1a is a plan view (not to scale) of a waveguide structure according to examples.
Figure 1A:
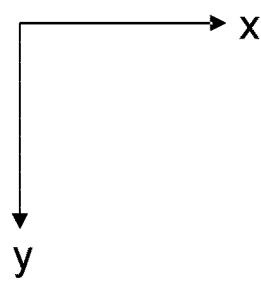
Figure 1B:
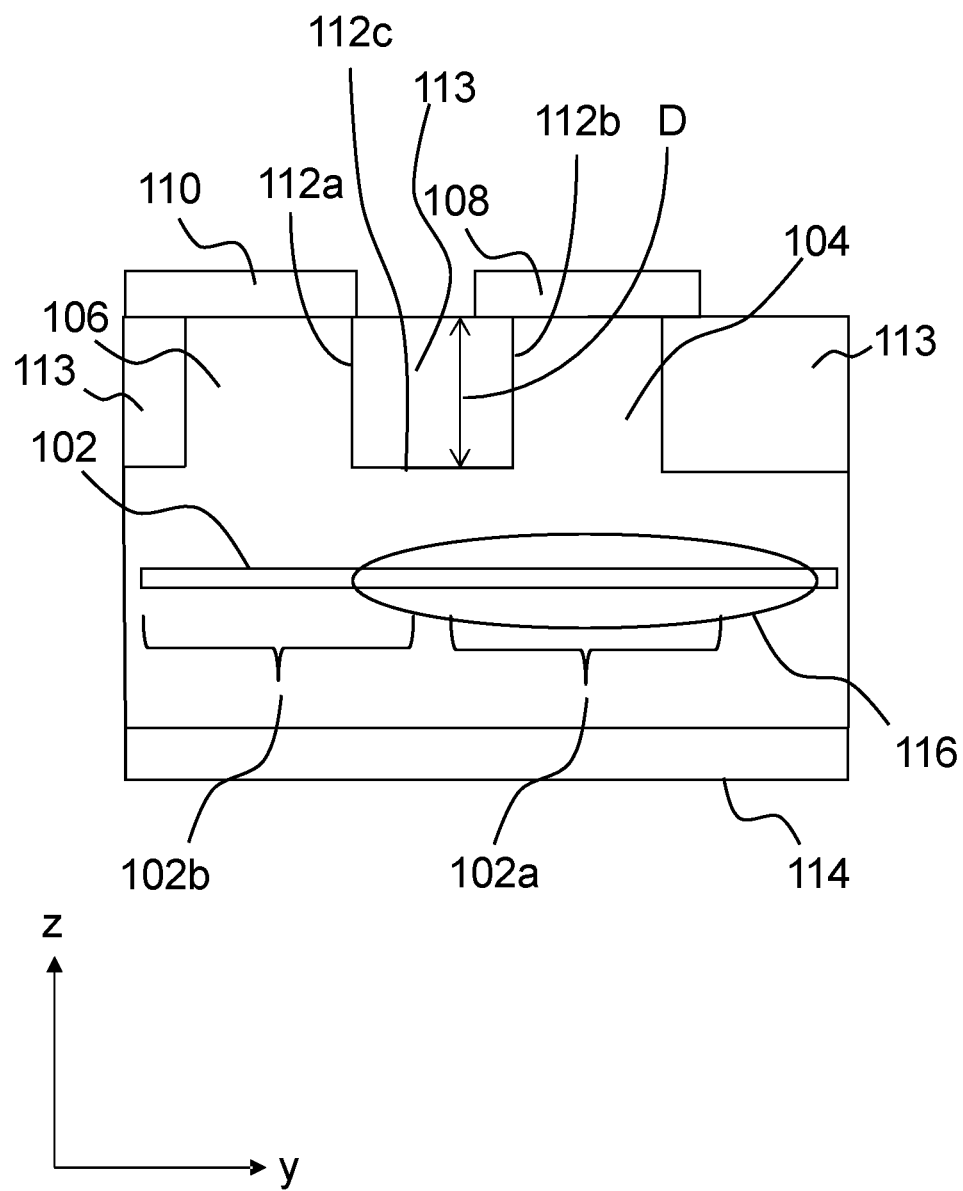
FIG. 1b is a cross-section view (not to scale) of a waveguide structure according to examples.

FIGS. 1a and 1b are schematic diagrams of a waveguide structure 100, which is a component of a Photonic Integrated Circuit (PIC). FIG. 1a is a plan view of the waveguide structure 100 and FIG. 1b is a cross-section view of the waveguide structure 100, as viewed along a guiding axis of the waveguide structure 100 indicated by the line A-A'.

Light guided by waveguide structures is typically not perfectly confined by the waveguide structure; some of the light escapes the waveguide and is therefore emitted in directions different to light guided by the waveguide structure. In some applications, such unguided light may undesirably be detected by components of the PIC other than the component of the component of the PIC to which the waveguide is designed to guide light or may influence amplification of light within the waveguide structure itself. Such unguided light is a potential source of noise for other components of a PIC. Examples described herein reduce such noise.

In examples such as that of FIGS. 1a and 1b, the waveguide structure 100 is a semiconductor optical amplifier (SOA). In other examples the waveguide structure 100 is a component other than an SOA; for example, the waveguide structure 100 may be an edge-emitting laser.

The waveguide structure 100 comprises a semiconductor structure formed on a semiconductor substrate onto which various layers forming the waveguide structure 100 are grown. For example, the semiconductor substrate may be an indium phosphide (InP) material and in examples a lower cladding layer is deposited onto the substrate, with a lower core layer having a higher refractive index than the lower cladding layer is deposited onto the lower cladding layer. An active region 102 (described below) is in examples deposited onto the lower core layer and an upper core layer is deposited onto the active region. An upper cladding layer having a refractive index lower than the upper core layer is deposited onto the active region to form a waveguide to guide light to the upper and lower core layers to increase interaction between light propagating in the waveguide structure and the active region 102.

In examples, each of the upper and lower cladding layers, the upper and lower core layers, and the active region 102 comprises multiple layers of different semiconductor material with thicknesses and compositions appropriate for performing a desired function.

To form the waveguide structure 100, the substrate is typically thinned or removed and contacts (e.g. metallic contacts) are formed on each of the p- and n-sides of the semiconductor structure.

The active region 102 is a region of the waveguide structure 100 comprising a diode junction (such as a p-n junction or p-i-n junction) capable of emitting photons by recombination of electrons and holes and/or absorbing photons by generation of electron-hole pairs. In a simple form, the diode junction comprises an interface between an n-doped semiconductor material and a p-doped semiconductor material. However, modern photonic components typically have active regions including structures for electronic confinement (such as quantum wells, quantum wires, or quantum dots) to confine charge carriers to particular spatial regions, thereby improving for example, recombination rates and/or waveguide structures to provide optical confinement (e.g. confinement of photons by differences in refractive index) to decrease optical losses and therefore increase the interaction between photons and charge carriers (for example, to increase rates of absorption and/or stimulation emission).

In examples, the substrate, lower cladding layer and lower core layer are doped with a dopant to form p-doped semiconductor materials and the upper core and upper cladding layers are doped with a dopant to form n-doped semiconductor layers, such that the interface between the p-doped semiconductor layers and the n-doped semiconductor layers, at or within the active region 102 forms a p-n junction. In other examples, the substrate, lower cladding layer and lower core layer are n-doped and the upper core and upper cladding layers are p-doped. In some examples the active region 102 itself is undoped (a so-called intrinsic semiconductor) to form a p-i-n junction.

The waveguide structure 100 also comprises one or more waveguides, which in examples such as that of the example shown in FIGS. 1a and 1b are channel waveguides. For example, the waveguides are ridge waveguides or rib waveguides. In other examples, the waveguides are other forms of waveguide such as isolated-stripe waveguides.

A ridge waveguide is an example of a channel waveguide as described above. Typically, a ridge waveguide is rectangular in cross section (e.g. having a planar top surface and two sidewall surface each forming an interface with a material with a lower refractive index than the material from which the ridge is made. However, in examples, the ridge is not perfectly rectangular in cross section. For example, the sidewalls are not straight and/or are not perfectly perpendicular to the substrate on which the ridge is formed. In some other examples, a ridge of a ridge waveguide is not rectangular in cross section but is instead differently shaped, for example trapezoidal in cross section, or in other examples has rounded or curved sidewalls (either convex or concave).

As shown in FIGS. 1a and 1b, the active region 102 comprises a light emission portion 102a and a light absorption portion 102b. A first waveguide corresponds to the light emission portion 102a, referred to hereinafter as the driven waveguide 104 (since in normal operation the junction under the waveguide is forward biased). A second waveguide, which is structurally the same or similar to the driven waveguide 104, corresponds to the light absorption portion 102b, referred to hereinafter as the absorber ridge 106. The driven waveguide 104 corresponds to the light emission portion 102a to the extent that a bias applied to the driven waveguide 104 primarily effects the light emission portion 102a and the absorber ridge 106 corresponds to the light emission portion 102a to the extent that a bias applied to the driven waveguide 104 primarily effects the light absorption portion 102b. For example, as shown in FIG. 1b, the driven waveguide 104 is located above the light emission portion 102a (in the z-axis) and the absorber ridge 106 is located above the light absorption portion 102b (in the z-axis). In other words, in the y-axis at least, the driven waveguide 104 is aligned with or overlaps the light emission portion 102a and the absorber ridge 104b is aligned with or overlaps the light absorption portion 102b.

The driven waveguide 104 and the absorber ridge 106 are each for example formed in at least the upper cladding layer of a semiconductor structure and may, in some examples, include the upper core layer. In some examples, as described below the driven waveguide 104 and/or the absorber ridge 106 includes the active region 102.

Light generated within the driven waveguide 104 is emitted in all directions, including in a first direction along the x-axis and a second direction perpendicular the first direction (e.g. along the y-axis. Light generated within the driven waveguide 104 that is emitted in directions that satisfy the conditions for total internal reflection is guided along the driven waveguide 104 (e.g. along the x-axis) but light generated within the driven waveguide 104 that is emitted in directions that do not satisfy the conditions for total internal reflection (e.g. light emitted in the second direction) escapes the driven waveguide 104.

Light emitted in the second direction may be absorbed by the absorber ridge 106 to prevent such light escaping the waveguide structure 100 and being, for example, a source of noise for other components of a PIC.

The driven waveguide 104 and the absorber ridge 104 extend longitudinally in a first direction denoted in FIG. 1a by an x-axis. Light is guided along the longitudinal axis of the driven waveguide 104 in the first direction such that the first direction is substantially parallel to the longitudinal axis of the driven waveguide 104 (e.g. parallel with the x-axis within acceptable performance tolerances).

The active region 102 is planar and extends along the x-axis and also extends in the y-axis perpendicular to the x-axis and shown in FIGS. 1a and 1b as the y-axis. The driven waveguide 104 and the absorber ridge 106 extend from the active region 102 along a z-axis that is perpendicular to both the x-axis and the y-axis.

A channel waveguide, such as the driven waveguide 104 is for example a waveguide that guides light (or any other propagating electromagnetic radiation) in two orthogonal dimensions. The guiding mechanism is based on a difference in refractive index; in particular a "core" of the waveguide has a refractive index that is higher than the material that surrounds it (commonly referred to as a "cladding") so as to provide an effect known as internal reflection (according to Snell's law). As is well-known, light propagating in a medium with a first refractive index and incident on an optical interface with a medium having a second, different, refractive index will be at least partially reflected. Where the second refractive index is lower than the first refractive index, propagating light will be totally reflective if the angle of incidence (with respect to the normal to the plane of the optical interface) of the propagating light is greater than a critical angle.

The difference in refractive index may be a result of different intrinsic material properties (e.g. based on the atomic spacing of the component elemental materials) and/or based on extrinsic factors such as externally applied electric fields (e.g. quantum induced effects) and/or concentrations of charge carriers in regions of a semiconductor material, (e.g. gain-guiding phenomena) that may affect the apparent refractive index experienced by an electromagnetic field propagating through the material.

In some examples the difference in refractive index is provided by etching or otherwise removing semiconductor material either side of the driven waveguide 104 to form one or more longitudinal recesses in an upper surface of the semiconductor material from which the waveguide structure 100 is manufactured. For example, as shown in FIG. 1b, between the driven waveguide 104 and the absorber ridge 106, a first recess is formed by removing semiconductor material to form a first sidewall 112a on a first side of the absorber waveguide 106, a second sidewall 112b on a first side of the driven waveguide 104 (opposite the first sidewall 112a), and a base portion 112c joining the first sidewall 112a and the second sidewall 112b. The base portion 112c is separated from the upper surface of the semiconductor structure by a depth, D (which for subsequent figures may be incremented by 1 and/or 2 when there are recesses having different depths with respect to the upper surface of the semiconductor structure). In some examples, the first and second sidewalls 112a, 112b are perpendicular to the substrate and the base portion 112c is parallel to the substrate to form a recess that is substantially rectangular (e.g. the first and second sidewalls 112a, 112b meet the base portion 112c at 90°±10°). In other examples, the first and second sidewalls 112a, 112b may be curved to meet at the base portion 112c to form a non-rectangular recess (e.g. a "U" shaped recess or a "V" shaped recess).

Similarly, such a recess may be formed on a second side of the driven waveguide 104 opposite the first side of the driven waveguide 104, and the second side of the absorber ridge 106 opposite the first side of the absorber ridge 106, as shown in FIG. 1b.

As shown in FIG. 1b, the recess(es) are at least partly filled with a layer or block of solid dielectric material 113 that is deposited after the driven waveguide 104 and the absorber ridge 106 are formed. For example, the recesses may be at least partly filled with a polyimide material or another dielectric material used to planarise semiconductor structures. For example, the recesses are filled with a material such as: benzocyclobutene (BCB), polymethylmethacrylate (PMMA), or SU-8. In this way, once manufactured, the waveguide structure 100 may not comprise a recess, as it is filled with a dielectric material, or there is a recess having a depth less than D because the recess has been partly filled. In other examples, the dielectric material filling the recesses may be air.

The driven waveguide 104 is located above the light emission portion 102a of the active region 102. In contact with the driven waveguide 104 is a first contact 108. The first contact 108 comprises, for example, one or metal layers and one or more doped semiconductor layers, selected to form an electrical contact through which charge carriers (e.g. electrons or holes) may, through the driven waveguide 104, be injected and/or extracted from the light emission portion 102a. In particular, in normal operation, the first contact 108 is forward biased (e.g. a positive voltage may be applied to the first contact with respect to a common potential) to provide a population inversion in the light emission portion 102a so that by a process of electron-hole recombination (which includes amplified spontaneous emission and/or stimulated emission) the light emission portion 102a generates light in the form of photons.

Similarly, the absorber ridge 106 is located above the light absorption portion 102b of the active region. In contact with the absorber ridge 106 is a second contact 110. Similar to the first contact 108, the second contact 110 comprises, for example, one or metal layers and one or more doped semiconductor layers, selected to form an electrical contact through which charge carriers (e.g. electrons or holes) may, through the absorber ridge 106, be injected into and/or extracted from the light absorption portion 102b.

The first and second contacts 108, 110 are for example, formed on an upper surface of the driven waveguide 104 and the absorber ridge 106. A further contact layer 114 may be deposited to form a ground contact on the underside of the waveguide structure 100. As shown in FIGS. 1a and 1b the further contact layer 114 may provide a common ground for electrical paths between both the first contact 108 and the second contact 110.

In use, a positive voltage (e.g. a forward bias) is usually applied to the first contact 108 with respect to the further contact 114, which is typically grounded (e.g. at zero volts), though may instead be floating. Such a positive voltage provides the necessary population inversion required for amplification of light received in the light emission portion 102a. For example, the first contact 108 may be electrically connected (e.g. via a solder joint to the first contact 108) to a first biasing circuit arranged to provide a first bias (e.g. a forward bias with respect to the further contact 114 to the first contact 108 and the second contact 110 may be electrically connected (e.g. via a solder joint to the second contact 110) to a second biasing circuit arranged to provide a second bias (e.g. a negative or reverse bias with respect to the further contact 114, or a ground bias, or a floating bias) to the second contact 110.

In use, a received optical signal 116a may be applied to a first end 104a of the driven waveguide 104. The received optical signal propagates as an optical field 116 along and be amplified as it traverses the driven waveguide 104 and be output at a second end 104b of the driven waveguide 104 as an amplified output signal 116b.

Photons emitted in the light emission portion 102a by spontaneous emission may be emitted in any direction. The direction of some of those photons will be such that the photons are guided by the driven waveguide 104 along the longitudinal axis of the driven waveguide 104 and may contribute to amplified spontaneous emission and/or stimulated emission and amplification of the received input signal 116a to generate the amplified output signal 116b. The direction of other photons will be such that they are not guided by the driven waveguide 104 and escape the driven waveguide 104; such photons may be considered as noise as described above.

The second contact 110 may be grounded (e.g. at zero volts) or floating. By grounding the second contact 110, charge carriers that are generated in the absorber ridge 106 in response to incident photons (e.g. emitted from the driven waveguide 104 in the second direction) are removed from the absorber ridge 106 so that those charge carriers do not recombine to generate photons that are re-emitted from the absorber ridge 106. In some examples, a reverse bias with respect to the potential at the further contact 114 may be applied to the second contact 110; this may, in some examples, improve the absorption efficiency of the absorber ridge 106.

At least one interface between the active region 102 and the surrounding semiconductor material may be inclined in the x-y plane with respect to light traversing the driven waveguide 104 along the x-axis. The reason for this is that there is a difference in refractive index between the semiconductor material of the active region 102 and the semiconductor material surrounding the active region 102. Such a difference in refractive index forms a reflective optical interface similar to that described above in relation to the operation of the ridge waveguide 104; such reflections may be detrimental to the operation of an SOA but by forming that interface at an angle as shown in FIG. 1a, those reflections may be directed away from the axis of the ridge waveguide 104 to a degree that prevents the reflected light to be guided by the ridge waveguide 104 (e.g. above the critical angle).

For example, as shown in FIG. 1a, the active region 102 is formed to be trapezoidal in plan view, such that the interfaces between each end of the active region 102 and the surrounding semiconductor material are in the x-y plane with respect to light traversing the driven waveguide 104 along the x-axis.

In other examples, one or more of the interfaces between the active region 102 and the surrounding semiconductor material may be perpendicular to the light traversing the driven waveguide along the x-axis. For example, when the waveguide structure 100 is for use in a laser device, it may be beneficial for light reflected at the optical interface between the active region 102 and the semiconductor material adjacent to the active region 102 to be perpendicular to the axis of the driven waveguide 104 so that light is reflected into the driven waveguide 104 to be amplified.

Figure 2:
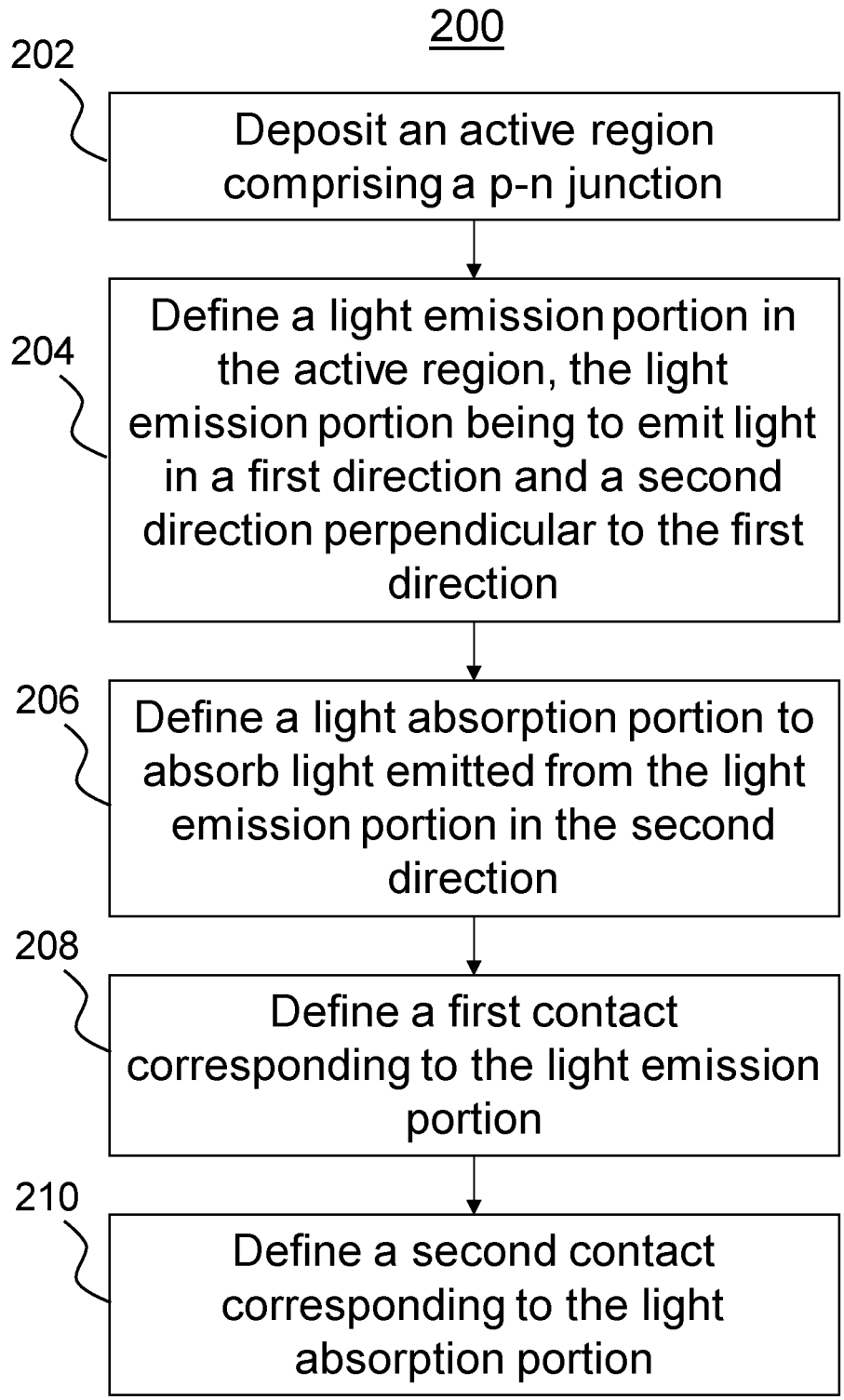
FIG. 2 is a flow diagram illustrating a method of fabricating a waveguide structure according to examples.

FIG. 2 shows a method of fabricating a waveguide structure for a photonic integrated circuit, such as the waveguide structure 100 described above with reference to FIGS. 1a and 1b. For example, as described above, the waveguide structure may be formed on a semiconductor substrate as described above and may comprise core and cladding layers that provide confinement of light in the z-axis.

At block 202, an active region is deposited. The active region comprises a diode junction, which, for example, comprises a p-n or p-i-n junction as described above. For example, the substrate, lower cladding layer and lower core layer are doped with a dopant to form p-doped semiconductor materials and the upper core and upper cladding layers are doped with a dopant to form n-doped semiconductor layers, such that the interface between the p-doped semiconductor layers and the n-doped semiconductor layers, at or within the active region 102 forms a p-n junction. In another example, the substrate, lower cladding layer and lower core layer are n-doped and the upper core and upper cladding layers are p-doped. In some examples the active region 102 itself may be undoped (a so-called intrinsic semiconductor) to form a p-i-n junction.

At block 204, a light emission portion is defined in the active region. For example, the light emission portion corresponds to the light emission portion 102a described above with reference to FIG. 1b and may be defined, for example, by the driven waveguide 104 described above with reference to FIGS. 1a and 1b. For example, the light emission portion is defined by a portion of the active region 102 which, as shown in FIG. 1b, is aligned with or is overlapped by the driven waveguide 104 located above the light emission portion 102a. Where the term defined is used in relation to the method 200, it is used to explain that the corresponding feature(s) are for example formed (e.g. by an etching or deposition process, with appropriate masking) to be aligned with or overlap one another at least in the y-axis.

At block 206, a light absorption portion is defined in the active region. For examples, the light absorption portion corresponds to the light absorption portion 1-2b described above with reference to FIG. 1b and is defined, for example, by the absorber ridge 106 described above with reference to FIGS. 1a and 1b. For example, the light absorption portion is defined by a portion of the active region which, as shown in FIG. 1b, is aligned with or is overlapped by the absorber ridge 106 located above the light absorption portion 102b.

At block 208, a first contact corresponding to the light emission portion (e.g. the light emission portion 102a described above with reference to FIG. 1b) is defined. For example, the first contact is an electrical contact formed on or in contact with the driven waveguide 104, such as the first contact 108 described above with reference to FIGS. 1a and 1b.

At block 210, a second contact corresponding to the light absorption portion (e.g. the light absorption portion 102b described above with reference to FIG. 1b) is defined. For example, the second contact is an electrical contact formed on or in contact with the absorber ridge 106, such as the second contact 110 described above with reference to FIGS. 1a and 1b.

In some examples, the first and second contacts are formed in openings in a dielectric material that is deposited over waveguides in the light emission portion and the light absorption portion. For example, as described above, between the driven waveguide 104 and the absorber ridge 106 there may be a recess as shown in FIGS. 1a and 1b. As described above, the recess may be filled with a dielectric material. In practice the application of the dielectric material may result in excess dielectric material being deposited onto the surfaces of the driven waveguide 104 and the absorber ridge 106, to which it is desirable to make an electrical contact. Accordingly, in some examples, the method 200 includes preparing an opening in such overlying dielectric material to provide access to the driven waveguide 104 and the absorber ridge 106. For example, the method 200 includes one or more lithography steps to define the portions of the driven waveguide 104 and/or the absorber ridge 106 to which a conductive contact is to be applied, and a subsequent etch process to remove the dielectric material from the defined portions of the driven waveguide 104 and/or the absorber ridge 106 to which a conductive contact is to be applied.

The examples described above with reference to FIGS. 1a and 1b provide a structure which absorbs light that is not guided along the driven waveguide 104 (e.g. absorbs light emitted in the second direction). Other structures are envisaged that provide improved absorption of light that is not guided along the driven waveguide 104.

Figure 3A:
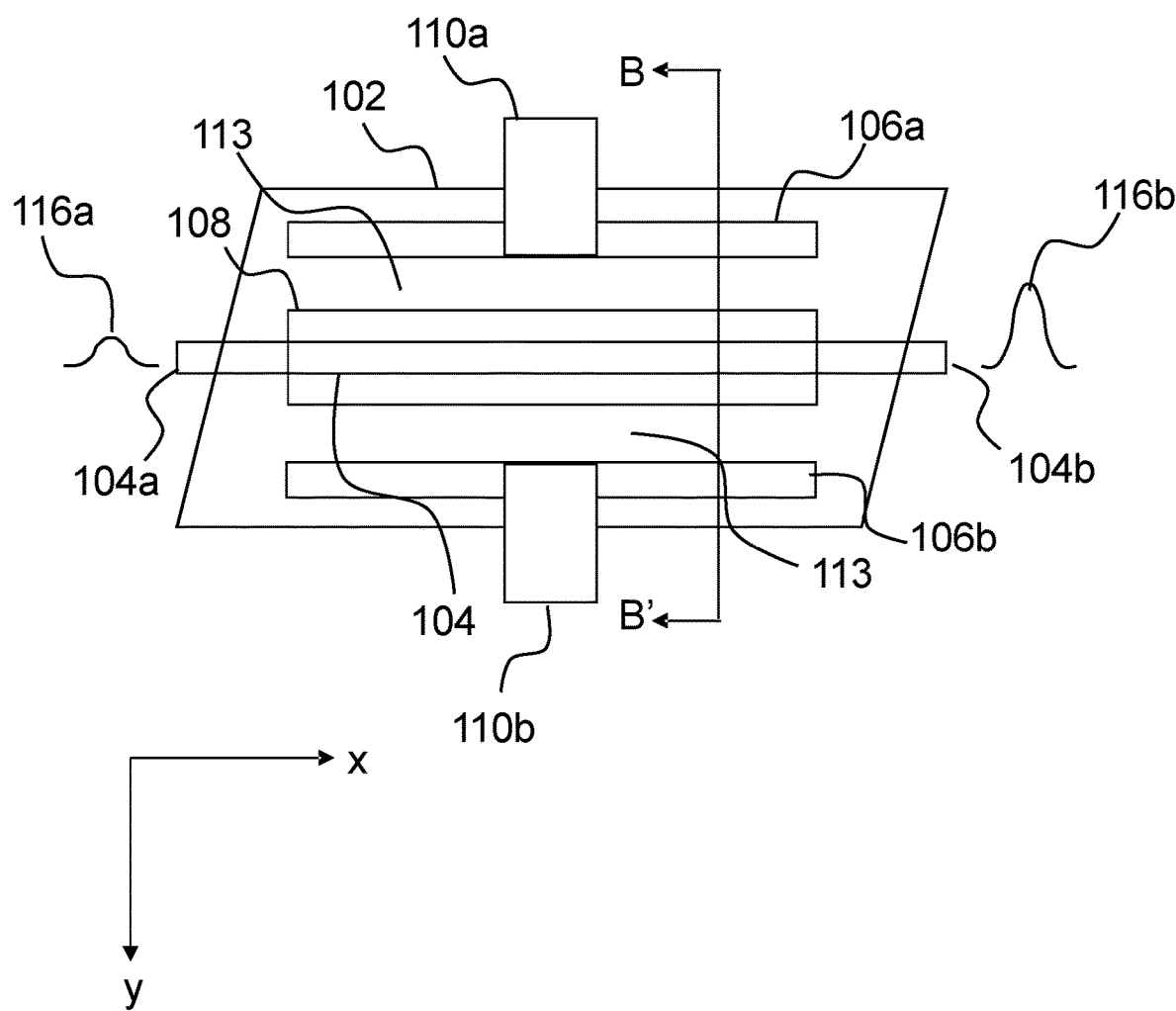
FIG. 3a is a plan view (not to scale) of a waveguide structure according to examples.
Figure 3B:
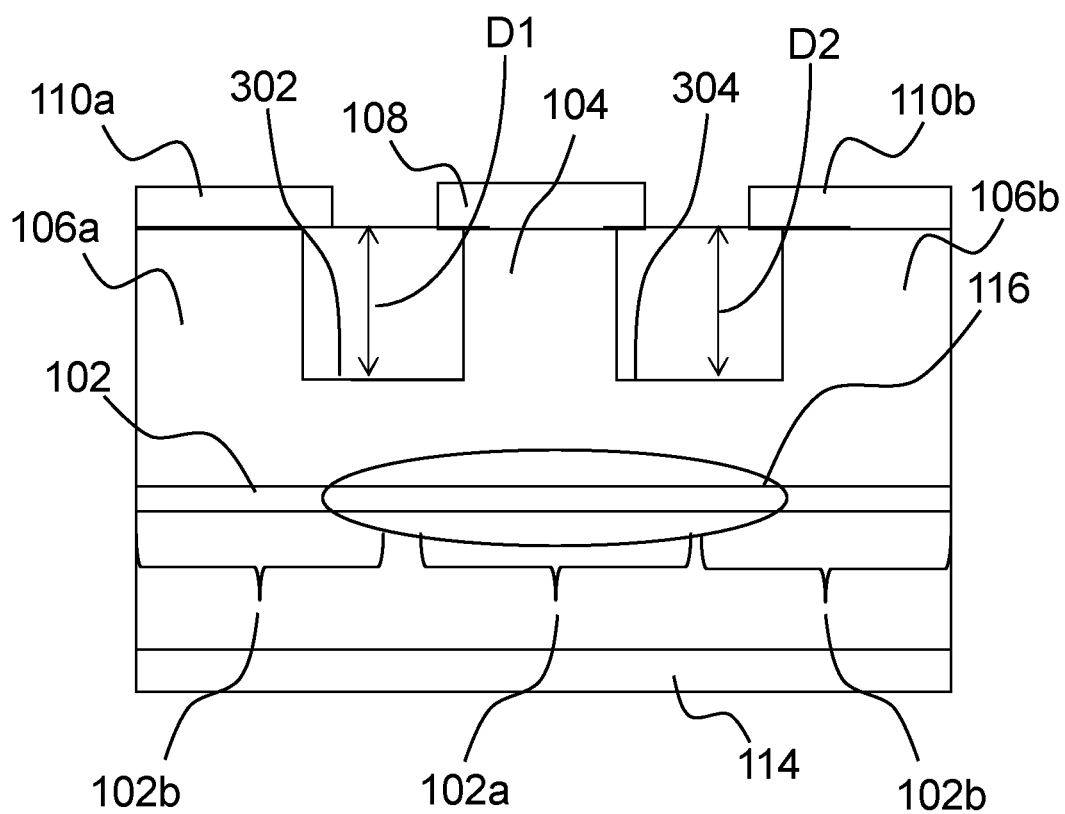
FIG. 3b is a cross-section view (not to scale) of a waveguide structure according to examples.

For example, FIGS. 3a and 3b are respectively a plan view and a cross-section view of a waveguide structure 300 according to other examples. The waveguide structure 300 is similar to that shown in FIGS. 1a and 1b and can be manufactured according to a similar method to that described above with reference to FIG. 2. Accordingly features shown in FIGS. 3a and 3b that appear in FIGS. 1a and 1b are given the same reference signs (incremented by a and/or b when in this example there are more than one earlier described feature) and earlier descriptions of those features apply here too, as appropriate. FIG. 3a is a plan view of the waveguide structure 300 and FIG. 3b is a cross-section view of the waveguide structure 300, as viewed along a guiding axis of the waveguide structure 300 indicated by the line B-B'.

The waveguide structure 300 shown in FIGS. 3a and 3b differs from that shown in FIGS. 1a and 1b in that it comprises two absorber ridges: a first absorber ridge 106a at one side of the driven waveguide 104 and a second absorber ridge 106b at the other side of the driven waveguide 104. Accordingly, in the example shown in FIGS. 3a and 3b, light that is not guided along the driven waveguide 104 but is emitted in the second direction may be absorbed by the first absorber ridge 106a if it is emitted from the driven waveguide 104 in a negative y-direction and absorbed by the second absorber ridge 106b if it is emitted in a third direction, opposite the second direction, from the driven waveguide 104 in a positive y-direction.

The waveguide structure 300 shown in FIGS. 3a and 3b comprises two of the recesses described above with reference to FIGS. 1a and 1b. The two recesses contain dielectric material 113 as described above. In the example shown in FIG. 3b, a first recess 302 has a first depth D1 with respect to the upper surface of the semiconductor structure and a second recess 304 has a second depth D2 with respect to the upper surface of the semiconductor structure. In FIG. 2 the depths D1 and D2 are equal (at least within acceptable manufacturing tolerances).

The contacts 110a, 110b corresponding to the first absorber ridge 106a and the second absorber ridge 106b may both be grounded, floating, or biased to the same reverse bias or may be biased to different biases to provide independent control of the absorption of the respective absorber ridges 106a, 106b.

Figure 4:
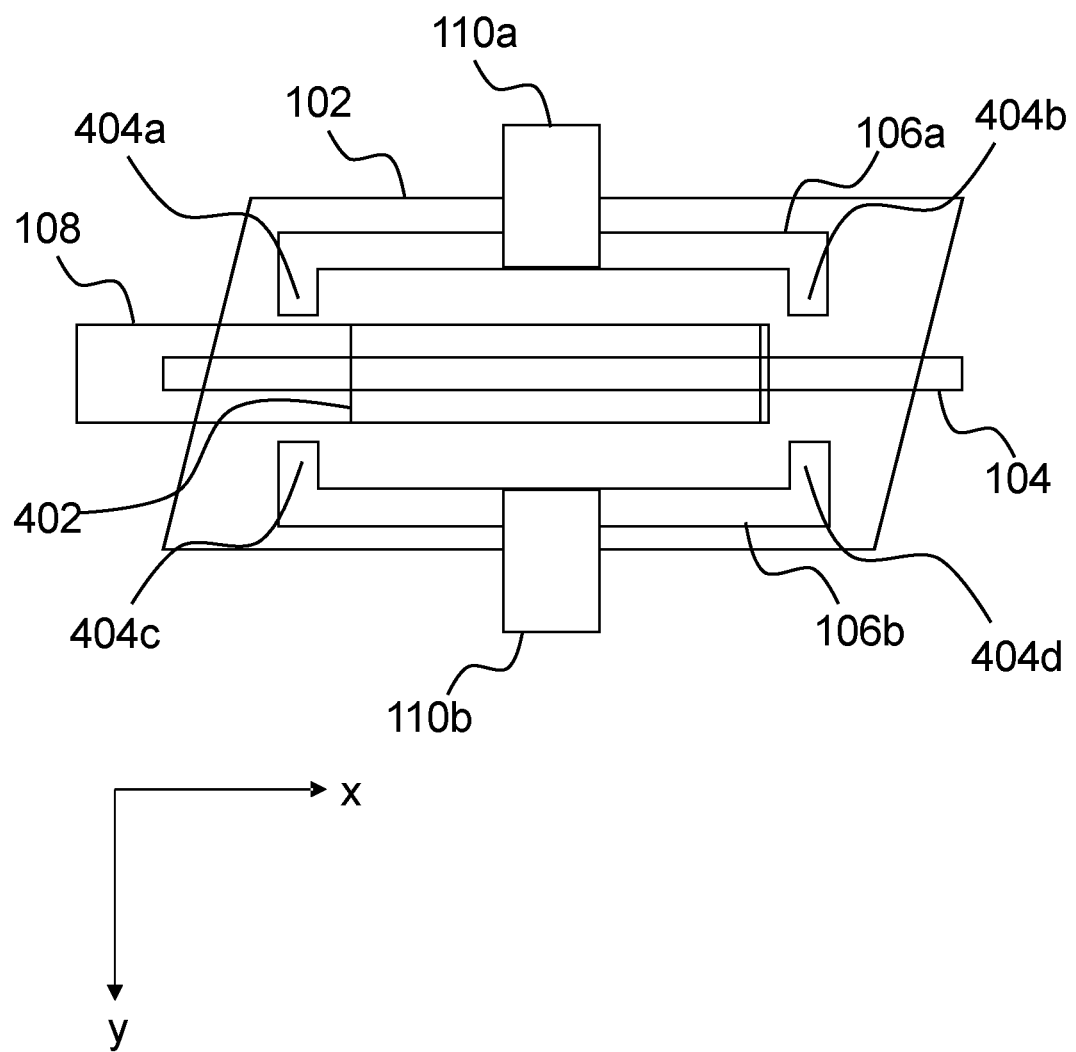
FIG. 4 is a plan view (not to scale) of a waveguide structure according to examples.

FIG. 4 is a plan view of a waveguide structure 400 according to other examples. The waveguide structure 300 is similar to that shown in FIGS. 3a and 3b and can be manufactured according to the method described above with reference to FIG. 2. Accordingly features shown in FIG. 4 that appear in FIGS. 3a and 3b (as well as FIGS. 1a and 1b) are given the same reference signs (incremented by a and/or b when in this example there are more than one earlier described feature) and earlier descriptions of those features apply here too, as appropriate.

In the example shown in FIG. 4, the first contact 108 is formed over an opening 402 in the dielectric material 113 deposited above the driven waveguide 104. The opening 402 extends for a certain length along the driven waveguide 104. In other examples, the dielectric material 113 may be replaced with a semiconductor material and the first contact 108 may be formed on the semiconductor material.

The absorber ridges 106a, 106b comprise one or more extensions that are arranged to increase the absorption of light that is unguided by the driven waveguide 104. For example, as shown in FIG. 4 there are extensions 404a-404d that extend from the ends of the respective absorber ridges 106a, 106b, in the y-direction, towards the driven waveguide 104. Each such extension 404a-404d in examples extends from a respective end of the respective absorber ridges 106a, 106b at a position along the x-axis. So, for example, a first extension 404a extends along the y-axis from a first end of the absorber ridge 106a and a second extension 404b extends along the y-axis from a second end of the absorber ridge 106b. Third and fourth extensions 404c, 404d extend similarly from first and second ends of the other absorber ridge 106b. This provides for improved absorption of light not guided by the driven waveguide 402; in particular, light that has a component in the x-direction such that it may otherwise miss the absorber ridges 106a, 106b might be absorbed by the extensions 404 and therefore be prevented from escaping from the waveguide structure 400.

The above examples are to be understood as illustrative examples of the invention. For example, although in the examples described above and shown in the cross-section views of FIGS. 1b and 3b, the recesses do not penetrate the active region, in further examples, one or more of the recesses may have a depth, D, that extends to or beyond the active region 102. This can provide improved electrical isolation between the driven waveguide 104 and the absorber ridges 106a, 106b. Furthermore, while in the example shown in FIG. 3b, the depths D1, D2 of the recesses 302, 304 are equal, in other examples the depths D1, D2 are unequal. In some such examples, the depth D1 of the first recess 302 is such that the recess 302 extends through the active region 102 whereas the depth D2 of the second recess is such that the recess 304 does not extend through the active region 102. In other examples, the depths D1, D2 of both the first and second recesses 302, 304 are such that both recesses extend through the active region 102.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

What is claimed is:

1. A waveguide structure for a photonic integrated circuit, comprising:
   a substrate;
   an active region comprising a diode junction, the active region comprising:
      a light emission portion to emit light in a first direction and a second direction perpendicular to the first direction; and
      a light absorption portion to absorb light emitted from the light emission portion in the second direction;
   a first contact corresponding to the light emission portion and configured for electrical connection of the light emission portion to a first biasing circuit;
   a second contact corresponding to the light absorption portion and configured for electrical connection of the light absorption portion to a second biasing circuit;
   a waveguide for guiding light; and
   an absorber structure for absorbing light unguided by the waveguide, the waveguide separated from the absorber structure by a recess in the waveguide structure.

2. The waveguide structure according to claim 1, wherein the light absorption portion is a first light absorption portion and the waveguide structure comprises:
   a second light absorption portion to absorb light emitted from the light emission portion in a third direction opposite the second direction; and
   a third contact corresponding to the second light absorption portion.

3. The waveguide structure according to claim 2, wherein the first contact is between the second contact and the third contact.

4. The waveguide structure according to claim 2, wherein the light emission portion is located between the first light absorption portion and the second light absorption portion.

5. The waveguide structure according to claim 1, the waveguide being a ridge waveguide having a longitudinal axis substantially parallel to the first direction.

6. The waveguide structure according to claim 1, wherein the waveguide is separated from the absorber structure by at least one of: semiconductor material; a dielectric material; air; polyimide; benzocyclobutene (BCB); polymethylmethacrylate (PMMA); or SU-8.

7. The waveguide structure according to claim 1, wherein the active region comprises an interface with a surrounding semiconductor material that is inclined with respect to the first direction.

8. The waveguide structure according to claim 1, wherein at least one of:
   the active region is a region in which an electron-hole pair may recombine to emit a photon and/or a photon may be absorbed to create an electron-hole pair; or
   the active region comprises one or more quantum wells.

9. The waveguide structure according to claim 1, the recess comprising a first sidewall on a first side of the waveguide, a second sidewall on a first side of the absorber structure, and a base portion joining the first sidewall and the second sidewall.

10. The waveguide structure according to claim 1, the absorber structure having a longitudinal axis substantially parallel to the first direction.

11. The waveguide structure according to claim 1, wherein at least one of: the absorber structure is a ridge, or the waveguide is a ridge.

12. A photonic integrated circuit comprising a waveguide structure, the waveguide structure comprising:
   a substrate;
   an active region comprising a diode junction, the active region comprising:

a light emission portion to emit light in a first direction and a second direction perpendicular to the first direction; and a light absorption portion to absorb light emitted from the light emission portion in the second direction;

a first contact corresponding to the light emission portion;

a second contact corresponding to the light absorption portion;

a waveguide for guiding light;

an absorber structure for absorbing light unguided by the waveguide, the waveguide separated from the absorber structure by a recess in the waveguide structure;

a first biasing circuit arranged to provide a forward bias to the first contact to generate light in the light emission portion of the active region; and a second biasing circuit arranged to provide a ground bias, a floating bias, or a reverse bias to the second contact to extract charge carriers generated in the light absorption portion of the active region.

* * * * *